United States Patent
Chen et al.

(10) Patent No.: US 10,910,201 B1
(45) Date of Patent: Feb. 2, 2021

(54) SYNTHETIC WAVELENGTHS FOR ENDPOINT DETECTION IN PLASMA ETCHING

(71) Applicant: Tokyo Electron Limited, Tokyo (JP)

(72) Inventors: Yan Chen, Cupertino, CA (US); Xinkang Tian, Fremont, CA (US); Vi Vuong, Fremont, CA (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 16/548,333

(22) Filed: Aug. 22, 2019

(51) Int. Cl.
| | |
|---|---|
| *H01J 37/32* | (2006.01) |
| *H01L 21/3065* | (2006.01) |
| *G06F 17/16* | (2006.01) |
| *H01L 21/67* | (2006.01) |

(52) U.S. Cl.
CPC ........ *H01J 37/32963* (2013.01); *G06F 17/16* (2013.01); *H01L 21/3065* (2013.01); *H01L 21/67063* (2013.01)

(58) Field of Classification Search
None
See application file for complete search history.

(56) References Cited

U.S. PATENT DOCUMENTS

| | | |
|---|---|---|
| 3,059,611 A | 10/1962 | Fury |
| 3,612,692 A | 10/1971 | Kruppa et al. |
| 4,147,435 A | 4/1979 | Habegger |
| 5,014,217 A | 5/1991 | Savage |
| 5,308,414 A | 5/1994 | O'Neill et al. |
| 5,347,460 A | 9/1994 | Gifford et al. |
| 5,353,790 A | 10/1994 | Jacques et al. |
| 5,450,205 A | 9/1995 | Sawin et al. |
| 5,751,416 A | 5/1998 | Singh et al. |
| 5,980,767 A | 11/1999 | Koshimizu et al. |
| 6,060,328 A | 5/2000 | En et al. |

(Continued)

FOREIGN PATENT DOCUMENTS

| | | |
|---|---|---|
| CN | 101038860 A | 9/2007 |
| CN | 101221891 A | 7/2008 |

(Continued)

OTHER PUBLICATIONS

Combined Chinese Office Action and Search Report dated Mar. 3, 2016 in Chinese Patent Application No. 201380054482.2 (with English translation), 12 pages.

(Continued)

*Primary Examiner* — Shamim Ahmed
(74) *Attorney, Agent, or Firm* — Oblon, McClelland, Maier & Neustadt, L.L.P.

(57) ABSTRACT

Described is a method for determining an endpoint of an etch process using optical emission spectroscopy (OES) data as an input. OES data is acquired by a spectrometer in a plasma etch processing chamber. The acquired time-evolving spectral data is first filtered and de-meaned, and thereafter transformed into transformed spectral data, or trends, using multivariate analysis such as principal components analysis, in which previously calculated principal component weights are used to accomplish the transform. Grouping of the principal components weights into two separate groups corresponding to positive and negative natural wavelengths, creates separate signed trends (synthetic wavelengths).

22 Claims, 8 Drawing Sheets

(56) References Cited

U.S. PATENT DOCUMENTS

| | | | |
|---|---|---|---|
| 6,081,334 | A | 6/2000 | Grimbergen et al. |
| 6,090,302 | A | 7/2000 | Smith, Jr. et al. |
| 6,132,577 | A | 10/2000 | Smith, Jr. et al. |
| 6,381,008 | B1 | 4/2002 | Branagh et al. |
| 6,420,194 | B1* | 7/2002 | Reitman .......... H01L 22/26 156/345.24 |
| 6,535,779 | B1 | 3/2003 | Birang et al. |
| 6,564,114 | B1 | 5/2003 | Toprac et al. |
| 6,582,618 | B1 | 6/2003 | Toprac et al. |
| 6,745,095 | B1 | 6/2004 | Ben-Dov et al. |
| 6,815,653 | B2 | 11/2004 | Tsay et al. |
| 6,830,939 | B2 | 12/2004 | Harvey et al. |
| 6,911,157 | B2 | 6/2005 | Edamura et al. |
| 6,958,484 | B2 | 10/2005 | Mitrovic |
| 7,241,397 | B2 | 7/2007 | Fink et al. |
| 7,328,126 | B2 | 2/2008 | Chamness |
| 7,334,477 | B1 | 2/2008 | Pirkle |
| 7,591,923 | B2 | 9/2009 | Mitrovic et al. |
| 8,048,326 | B2 | 11/2011 | Yue et al. |
| 8,158,017 | B2 | 4/2012 | Hudson |
| 8,173,451 | B1 | 5/2012 | Tian et al. |
| 8,415,884 | B2 | 4/2013 | Chen et al. |
| 8,416,509 | B2 | 4/2013 | Yi et al. |
| 8,513,583 | B2 | 8/2013 | Corke et al. |
| 8,553,218 | B2 | 10/2013 | Tinnemans et al. |
| 9,200,950 | B2 | 12/2015 | Lian et al. |
| 2002/0029851 | A1 | 3/2002 | Edamura et al. |
| 2003/0132195 | A1 | 7/2003 | Edamura et al. |
| 2004/0104681 | A1 | 6/2004 | Mitrovic |
| 2005/0019961 | A1* | 1/2005 | Davis .......... H01J 37/32935 438/7 |
| 2005/0055175 | A1* | 3/2005 | Jahns .......... G05B 23/0254 702/182 |
| 2008/0186473 | A1 | 8/2008 | Lee |
| 2008/0291428 | A1 | 11/2008 | Taraboukhine |
| 2009/0029489 | A1* | 1/2009 | Park .......... H01J 37/32963 438/9 |
| 2009/0280581 | A1 | 11/2009 | Hudson |
| 2011/0174776 | A1 | 7/2011 | Kabe et al. |
| 2011/0315661 | A1 | 12/2011 | Morisawa et al. |
| 2012/0085494 | A1 | 4/2012 | Uchida et al. |
| 2012/0175060 | A1 | 7/2012 | Hudson et al. |
| 2013/0016344 | A1 | 1/2013 | Bullock et al. |
| 2013/0141720 | A1 | 6/2013 | Park et al. |
| 2015/0241272 | A1 | 8/2015 | Lian et al. |
| 2016/0172258 | A1 | 6/2016 | Chen et al. |

FOREIGN PATENT DOCUMENTS

| | | |
|---|---|---|
| CN | 102282654 A | 12/2011 |
| CN | 109643673 A | 4/2019 |
| EP | 0 652 415 A1 | 10/1994 |
| TW | 589659 | 6/2004 |
| WO | 2009-076299 A2 | 6/2009 |

OTHER PUBLICATIONS

Ventzek, P.L.G., et al., "Formation, Nature, and Stability of the Arsenic-Silicon-Oxygen Alloy for Plasma Doping of Non-Planar Silicon Structures", Applied Physics letters, vol. 105, 2014, pp. 262102-1-262102-5 with cover page.

Combined Taiwanese Office Action and Search Report dated May 25, 2015 in Taiwanese Patent Application No. 102137525 (with English translation), 19 pages.

White, D.A., "Multivariate Analysis of Spectral Measurements for the Characterization of Semiconductor Processes", Dissertation presented Apr. 2002, at Massachusetts Institute of Technology, pp. 1-357.

Goodlin, B.E., "Multivariate Endpoint Detection of Plasma Etching Processes", Dissertation presented Apr. 2002, at Massachusetts Institute of Technology, pp. 1-226.

International Search Report and Written Opinion dated Mar. 19, 2014 in PCT/US2013/065378, 22 pages.

Yue, H.H., et al., "Plasma Etching Endpoint Detection Using Multiple Wavelengths for Small Open-Area Wafers", J. Vac. Sci. Technol. A, vol. 19 No. 1, 2001, pp. 66-75 with cover page.

White, D., et al., "Low-Open Area Endpoint Detection using a PCA based $T^2$ Statistic and Q Statistic on Optical Emission Spectroscopy Measurements", IEEE Transactions on Semiconductor Manufacturing, vol. 13 No. 2, May 2000, pp. 1-30.

Goodlin, B. E., et al., "Quantitative Analysis and Comparison of Endpoint Detection Based on Multiple Wavelength Analysis", $201^{st}$ Meeting of the Electrochemical Society, International Symposium on Plasma Processing XIV, Abs. 415, May 2002, pp. 1-30.

Chinese Office Action dated Oct. 31, 2016 in Chinese Patent Application No. 201380054482.2 (with English translation), 10 pages.

Japanese Office Action dated Jul. 5, 2016 in Japanese Patent Application No. 2015-537813 (with English translation), 4 pages.

Combined Taiwanese Office Action and Search Report dated Jan. 2, 2018 in Taiwanese Patent Application No. 105137371 (with English translation), 16 pages.

International Search Report and Witten Opinion dated Jan. 31, 2017 in PCT/US2016/062017, 13 pages.

Master's Thesis of Jae-Wook Lee, presented at University of California, Berkeley, Jul. 1, 2000, 69 pages.

Shannon, S., et al., "A Spatially Resolved Optical Emission Sensor Plasma Etch Monitoring", Appl. Phys. Lett., vol. 71 No. 11, Sep. 1997, pp. 1467-1468.

Selwyn, G.S., "Optical Diagnostic Techniques for Plasma Processing", AVS Press, 1993, Relevant chapter 3 on Optical Emission Spectroscopy (OES) is provided, pp. 26-80 with title and bibliographic information pages.

International Search Report and Written Opinion dated Nov. 17, 2020 in counterpart International Application No. PCT/US2020/046822, citing references AA-AC and AO-AP above.

* cited by examiner

SYNTHETIC WAVELENGTHS FOR ENDPOINT DETECTION IN PLASMA ETCHING

BACKGROUND

Technical Field

The present application relates to a method and system for controlling the process of etching a structure on a substrate, for example, in semiconductor manufacturing. More particularly, it relates to a method for determining an endpoint of an etch process of the substrate.

RELATED APPLICATIONS

This application is related to the U.S. Pat. No. 9,330,990 ('990), titled "Method of endpoint detection of plasma etching process using multivariate analysis" and U.S. Pat. No. 10,002,804, titled "Method of endpoint detection of plasma etching process using multivariate analysis".

DESCRIPTION OF THE RELATED ART

Plasma etch processes are commonly used in conjunction with photolithography in the process of manufacturing semiconductor devices, liquid crystal displays (LCDs), light-emitting diodes (LEDs), and some photovoltaics (PVs). Generally, a layer of a radiation-sensitive material, such as photoresist, is first coated on a substrate and exposed to patterned light to impart a latent image thereto. Thereafter, the exposed radiation-sensitive material is developed to remove exposed radiation-sensitive material (or unexposed, if negative tone photoresist is used), leaving a pattern of radiation-sensitive material which exposes areas to be subsequently etched, and covers areas where no etching is desired. During the etch process, for example, a plasma etch process, the substrate and radiation-sensitive material pattern are exposed to energetic ions in a plasma processing chamber, so as to effect removal of the material underlying the radiation-sensitive material in order to form etched features, such as vias, trenches, etc. Following etching of the features in the underlying material, the remainder of the radiation-sensitive material is removed from the substrate using a stripping process, to expose formed etched structures ready for further processing.

In many types of devices, such as semiconductor devices, the plasma etch process is performed in a first material layer overlying a second material layer, and it is important that the etch process be stopped accurately once the etch process has formed an opening or pattern in the first material layer, without continuing to etch the underlying second material layer.

For purposes of controlling the etch process, various types of endpoint control are utilized, some of which rely on analyzing the chemistry of the gas in the plasma processing chamber in order to deduce whether the etch process has progressed, for example, to an underlying layer of a different chemical composition than the chemical composition of the layer being etched. Other processes may rely on direct in-situ measurements made of structures being etched. In the former group, optical emission spectroscopy (OES) is frequently used to monitor the chemistry of the gas in the plasma processing chamber. The chemical species of the gas in the plasma processing chamber are excited by the plasma excitation mechanism being used, and the excited chemical species produce distinct spectral signatures in the optical emission spectrum of the plasma. Changes in the optical emission spectrum due to, for example, clearing of a layer being etched, and exposing of an underlying layer on the substrate, can be monitored and used to precisely end the etch process, i.e., reach the endpoint, so as to avoid etching of the underlying layer or formation of other yield defeating defects, such as undercuts, etc.

Depending on the types of structures being etched and the etch process parameters, the change of the optical emission spectrum of the plasma at the endpoint of the etch process may be very pronounced and easy to detect, or conversely, subtle and very difficult to detect. For example, etching of structures with a very low open ratio can make endpoint detection difficult using current algorithms for processing OES data. Improvements are therefore needed to make etch endpoint detection based on OES data more robust in such challenging etch process conditions.

SUMMARY

A feature of the present application relates to a method for determining an etch process endpoint in an etch process, where, at the endpoint, the etch process is stopped accurately once the etch process has formed an opening or pattern in a first material layer, without continuing to etch the underlying second material layer.

In one non-limiting embodiment, OES data is acquired for different etch processing runs, to obtain OES data matrices, average OES data matrices, and a mean OES data matrix. This data is used so that a multivariate model can be established of the acquired OES data. Once the multivariate model of the OES data has been established, it is used subsequently for an in-situ etch endpoint detection.

An analysis grouping wavelengths of similar behavior is used to determine a weights vector P to transform the OES data vector into the trend domain. Preferentially, by grouping the principal components weights into two separate groups corresponding to positive and negative natural wavelengths, separate signed trends (synthetic wavelengths) are created.

Having determined the synthetic wavelengths, during the in-situ etch endpoint detection, functional forms of time evolving values of the synthetic wavelengths are plotted vs. time to determine an endpoint of the etch process.

For example, in one embodiment, the time evolution of a ratio of synthetic wavelengths or the time evolution of the time derivative of a ratio of synthetic wavelengths is calculated. However, in other embodiments, any other functional forms may be calculated, such as, squares of the ratio of the synthetic wavelengths or just a single signed synthetic wavelength or just a natural wavelength trend.

In a further non-limiting embodiment, to compensate for OES drift between different wafers, the normalized OES spectrum is used in a principal components analysis (PCA) method.

After the time-evolving trend variable has been calculated, a decision is made on whether an endpoint has been reached. If indeed an endpoint has been reached, the etch process ends, otherwise the etch process is continued, and continuously monitored for etch endpoints.

The generation of synthetic wavelengths enables similar trending as the natural wavelengths for the endpoint detection, but with higher signal to noise ratio (SNR) endpoint signals.

BRIEF DESCRIPTION OF THE DRAWINGS

The application will be better understood in light of the description which is given in a non-limiting manner, accompanied by the attached drawings in which.

DETAILED DESCRIPTION OF THE PREFERRED EMBODIMENTS

Reference throughout this specification to "one embodiment" or "an embodiment" means that a particular feature, structure, material, or characteristic described in connection with the embodiment is included in at least one embodiment of the application, but do not denote that they are present in every embodiment. Thus, the appearances of the phrases "in one embodiment" or "in an embodiment" in various places throughout this specification are not necessarily referring to the same embodiment of the application. Furthermore, the particular features, structures, materials, or characteristics may be combined in any suitable manner in one or more embodiments.

Figure 1:
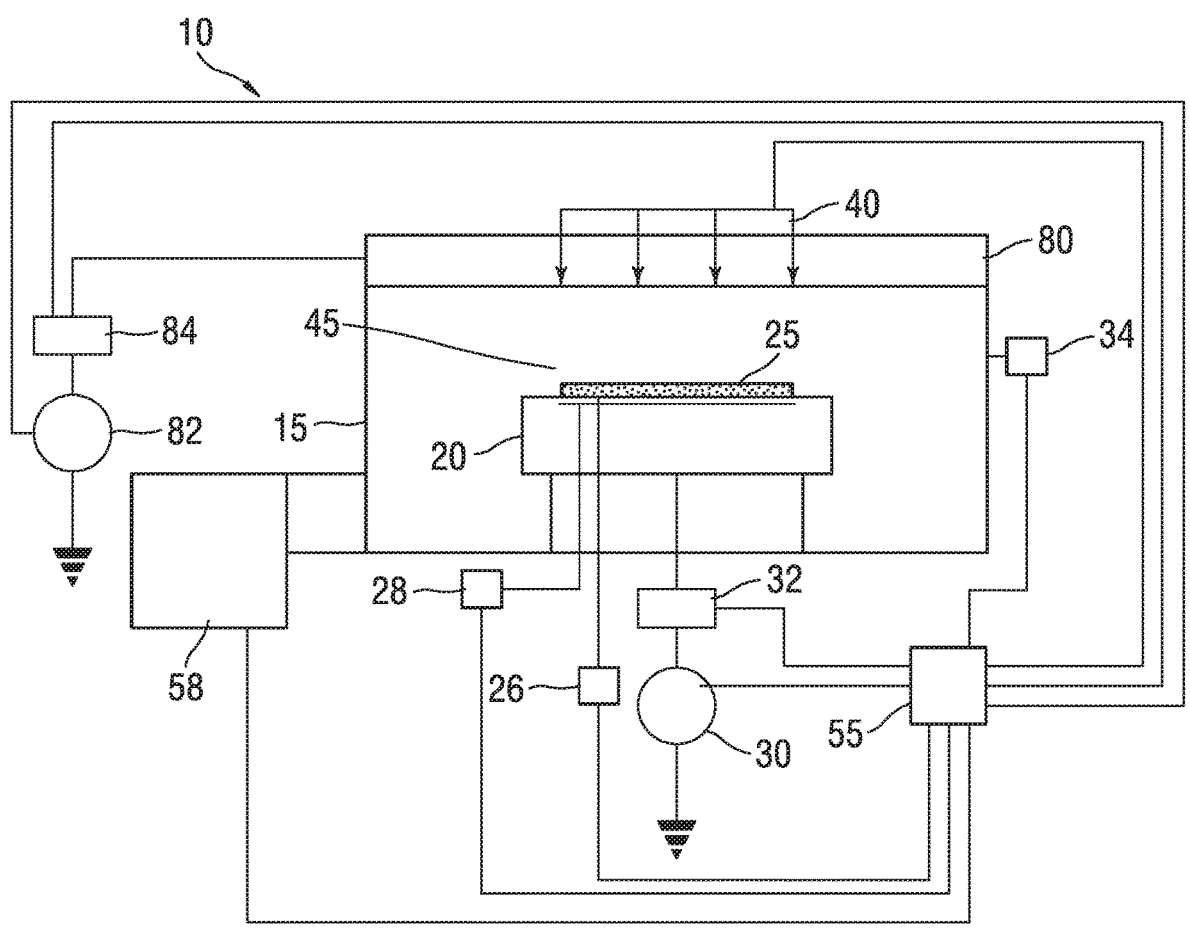
FIG. 1 is a schematic of an exemplary plasma etch processing system with a light detection device including a spectrometer used for acquisition of OES data, and a controller implementing the etch endpoint detection method described herein.

According to an embodiment of the present application, depicted in FIG. 1 is a plasma etch processing system 10 and a controller 55, wherein the controller 55 is coupled to the plasma etch processing system 10. Controller 55 is configured to monitor the performance of the plasma etch processing system 10 using data obtained from a variety of sensors disposed in the plasma etch processing system 10. For example, controller 55 can be used to control various components of the plasma etch processing system 10, to detect faults, and to detect an endpoint of an etch process.

According to the illustrated embodiment of the present application depicted in FIG. 1, the plasma etch processing system 10 includes a process chamber 15, substrate holder 20, upon which a substrate 25 to be processed is affixed, gas injection system 40, and vacuum pumping system 58. Substrate 25 can be, for example, a semiconductor substrate, a wafer, or an LCD. The plasma etch processing system 10 can be, for example, configured to facilitate the generation of plasma in processing region 45 adjacent to a surface of substrate 25, where plasma is formed via collisions between heated electrons and an ionizable gas. An ionizable gas or mixture of gases is introduced via gas injection system 40, and the process pressure is adjusted. Desirably, plasma is utilized to create materials specific to a predetermined materials process, and to aid the removal of material from the exposed surfaces of substrate 25. For example, a controller 55 can be used to control a vacuum pumping system 58 and gas injection system 40.

Substrate 25 can be, for example, transferred into and out of the plasma etch processing system 10 through a slot valve (not shown) and a chamber feed-through (not shown) via a robotic substrate transfer system where it is received by substrate lift pins (not shown) housed within substrate holder 20 and mechanically translated by devices housed therein. Once substrate 25 is received from the substrate transfer system, it is lowered to an upper surface of the substrate holder 20.

For example, the substrate 25 can be affixed to the substrate holder 20 via an electrostatic clamping system 28. Furthermore, the substrate holder 20 can further include a cooling system including a re-circulating coolant flow that receives heat from the substrate holder 20 and transfers heat to a heat exchanger system (not shown), or when heating, transfers heat from the heat exchanger system. Moreover, gas can be delivered to the back-side of the substrate via a backside gas delivery system 26 to improve the gas-gap thermal conductance between the substrate 25 and the substrate holder 20. Such a system can be utilized when temperature control of the substrate is required at elevated or reduced temperatures. For example, temperature control of the substrate can be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermo-electric heaters/coolers can be included.

With continuing reference to FIG. 1, a process gas can be, for example, introduced to processing region 45 through gas injection system 40. Process gas can, for example, include a mixture of gases such as argon, $CF_4$ and $O_2$, or Ar, $C_4F_8$ and $O_2$ for oxide etch applications, or other chemicals, such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$. Gas injection system 40 includes a showerhead, where process gas is supplied from a gas delivery system (not shown) to the processing region 45 through a gas injection plenum (not shown) and a multi-orifice showerhead gas injection plate (not shown).

As further shown in FIG. 1, the plasma etch processing system 10, includes a plasma source 80. For example, RF or microwave power can be coupled from generator 82 through impedance match network or tuner 84 to the plasma source 80. A frequency for the application of RF power to the plasma source ranges from 10 MHz to 200 MHz and is preferably 60 MHz, for capacitively-coupled (CCP), inductively-coupled (ICP), and transformer-coupled (TCP) plasma sources. For microwave plasma sources 80, such as electron cyclotron (ECR) and surface wave plasma (SWP) sources, typical frequencies of operation of generator 82 are between 1 and 5 GHz, and preferably about 2.45 GHz. An example of a SWP source 80 is a radial line slotted antenna (RLSA) plasma source. Moreover, the controller 55 can be coupled to generator 82 and impedance match network or tuner 84 in order to control the application of RF or microwave power to the plasma source 80.

As shown in FIG. 1, substrate holder 20 can be electrically biased at an RF voltage via the transmission of RF power from RF generator 30 through impedance match network 32 to substrate holder 20. The RF bias can serve to attract ions from the plasma formed in processing region 45, to facilitate the etch process. The frequency for the application of power to the substrate holder 20 can range from 0.1 MHz to 30 MHz and is preferably 2 MHz. Alternately, RF power can be applied to the substrate holder 20 at multiple frequencies. Furthermore, impedance match network 32 serves to maximize the transfer of RF power to plasma in process chamber 15 by minimizing the reflected power. Various match network topologies (e.g., L-type, π-type, T-type, etc.) and automatic control methods can be utilized.

Various sensors are configured to receive tool data from the plasma etch processing system 10. The sensors can include both sensors that are intrinsic to the plasma etch processing system 10 and sensors extrinsic to the plasma etch processing system 10. Intrinsic sensors can include those sensors pertaining to the functionality of the plasma etch processing system 10 such as the measurement of the Helium backside gas pressure, Helium backside flow, electrostatic chuck (ESC) voltage, ESC current, substrate holder 20 temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, capacitor settings (i.e., C1 and C2 positions), a focus ring thickness, RF hours, focus ring RF hours, and any statistic thereof. Alternatively, extrinsic sensors can include those not directly related to the functionality of the plasma etch processing system 10, such as, a light detection device 34 for monitoring the light emitted from the plasma in processing region 45 as shown in FIG. 1.

The light detection device 34 may include a detector, such as, a (silicon) photodiode or a photomultiplier tube (PMT) for measuring the total light intensity emitted from the plasma. The light detection device 34 may further include an optical filter, such as, a narrow-band interference filter. In an alternate embodiment, the light detection device 34 may include a line CCD (charge coupled device) or a CID (charge injection device) array and a light dispersing device such as a grating or a prism. Additionally, the light detection device 34 may include a monochromator (e.g., grating/detector system) for measuring light at a given wavelength, or a spectrometer (e.g., with a rotating or fixed grating) for measuring the light spectrum. The light detection device 34 may include a high resolution OES sensor from Peak Sensor Systems. Such an OES sensor has a broad spectrum that spans the ultraviolet (UV), visible (VIS) and near infrared (NIR) light spectrums. In the Peak Sensor System, the resolution is approximately 1.4 Angstroms, that is, the sensor is capable of collecting 5550 wavelengths from 240 to 1000 nm. In the Peak System Sensor, the sensor is equipped with high sensitivity miniature fiber optic UV-VIS-NIR spectrometers which are, in turn, integrated with 2048 pixel linear CCD arrays.

The spectrometers in one embodiment of the present application receive light transmitted through single and bundled optical fibers, where the light output from the optical fibers is dispersed across the line CCD array using a fixed grating. Similar to the configuration described above, light transmitted through an optical vacuum window is focused onto the input end of the optical fibers via a lens or a mirror. Different spectrometers, each specifically tuned for a given spectral range (UV, VIS and NIR), or broadband spectrometers covering UV, VIS and NIR, form a sensor for a process chamber. Each spectrometer includes an independent analog to digital (A/D) converter. Lastly, depending upon the sensor utilization, a full emission spectrum can be recorded every 0.01 to 1.0 seconds or faster.

Alternatively, in an embodiment, a spectrometer with all reflective optics may be employed by the light detection device 34. Furthermore, in an embodiment, a single spectrometer involving a single grating and a single detector for the entire range of light wavelengths being detected may be used. The design and use of optical emission spectroscopy hardware for acquiring optical OES data using e.g. the light detection device 34, are well known to those skilled in the art of optical plasma diagnostics.

Controller 55 includes a microprocessor, a memory, and a digital I/O port (potentially including D/A and/or AD converters) capable of generating control voltages sufficient to communicate and activate inputs to the plasma etch processing system 10 as well as monitor outputs from plasma etch processing system 10. As shown in FIG. 1, the controller 55 may be coupled to and exchange information with the RF generator 30, the impedance match network 32, the gas injection system 40, the vacuum pumping system 58, the backside gas delivery system 26, the electrostatic clamping system 28, and the light detection device 34. A program stored in the memory is utilized to interact with the aforementioned components of the plasma etch processing system 10 according to stored process instructions. One example of controller 55 is a DELL PRECISION WORKSTATION 530™, available from Dell Corporation, Austin, Tex. Controller 55 may be locally located relative to the plasma etch processing system 10, or it may be remotely located relative to the plasma etch processing system 10. For example, the controller 55 may exchange data with the plasma etch processing system 10 using at least one of a direct connection, an intranet, and the internet. Controller 55 may be coupled to an intranet at, for example, a customer site (i.e., a device maker, etc.), or it may be coupled to an intranet at, for example, a vendor site (i.e., an equipment manufacturer). Additionally, for example, the controller 55 may be coupled to the internet. Furthermore, another computer (i.e., controller, server, etc.) may, for example, access the controller 55 to exchange data via at least one of a direct connection, an intranet, and the internet. The controller 55 also implements an algorithm for detection of an endpoint of an etch process being performed in the plasma etch processing system 10, based on input data provided from the light detection device 34, as described further herein.

In a plasma etching process, endpoint detection (EPD) using optical emission spectroscopy is an important technique to control the etching consistency among wafers. Monitoring a time varying trend created from one or two selected optical emission wavelengths, reveals an endpoint, to pause or stop the etching process. Multivariate data analysis using synthetic wavelengths helps to improve the SNR and the robustness of the EPD. However, a synthetic wavelength generated from multivariate data analysis is generally unable to keep some intrinsic properties of the natural wavelength, such as being physically meaningful.

Grouping of the natural wavelengths using a multivariate model (one non-limiting example of which is PCA) may generate synthetic wavelengths which enable similar trending as a natural wavelength for EPD, but with higher SNR endpoint signal. In one example, non-limiting embodiment of the present application, the grouping comprises selecting natural wavelengths demonstrating either constructive or destructive contributions and separate positive and negative weights for the wavelengths are used in the grouping of the wavelengths to transform the OES data into the PCA domain. However, other ways of grouping of the wavelengths may be used in the generation of the synthetic OES data.

Figure 2:
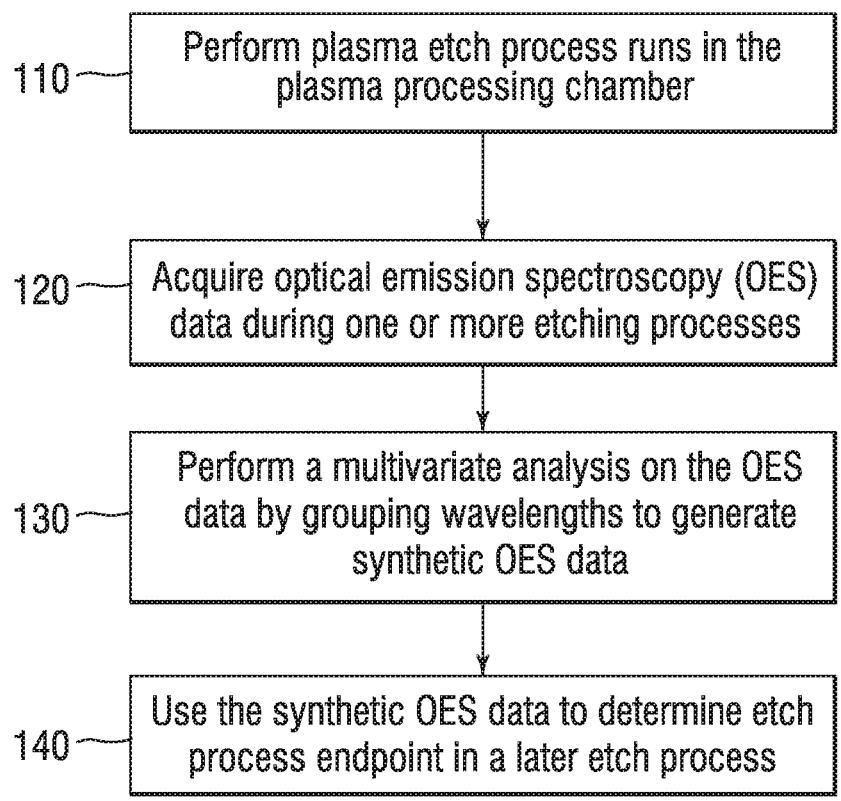
FIG. 2 is an exemplary flowchart of the method of preparing etch endpoint data for later in-situ etch point detection using multivariate analysis.

The process of endpoint determination in accordance with an embodiment proceeds in two phases. In the first phase, plasma etch process runs are performed in the plasma processing chamber 15 (step 110 in FIG. 2), and OES data is acquired using the light detection device 34 during one or more etch processing runs performed in the plasma etch processing system 10 (step 120), such that a multivariate model can be established of the acquired OES data (step 130).

Once the multivariate model of the OES data has been established, it can be used in a second phase for in-situ etch endpoint detection, as long as the etch process being run during the second phase is reasonably similar in terms of structures being etched, etch process conditions, etch processing system used, etc., to those used in the one or more etch processing runs performed in the first phase (step 140). This is to ensure the validity of multivariate model.

Figure 3:
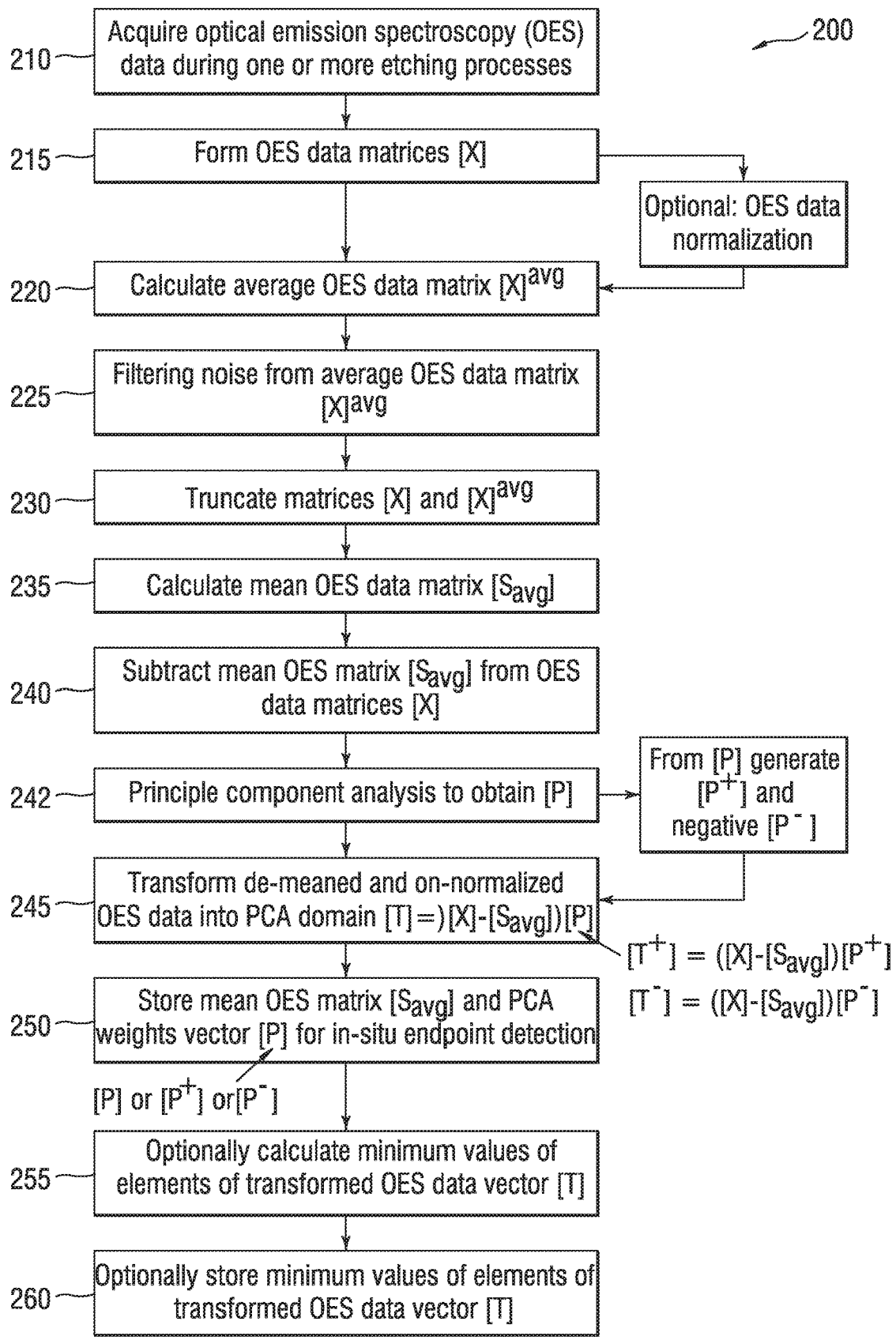
FIG. 3 is an exemplary flowchart of the method of preparing etch endpoint data for later in-situ etch point detection using PCA analysis.

In one non-limiting embodiment of the endpoint determination (shown in FIG. 3) where the PCA analysis multivariate model is used with a particular grouping of the natural wavelengths (i.e., with positive and negative weights), the endpoint detection 200 starts with etch process runs being performed and OES data being acquired, using, for example, the light detection device 34. During each plasma etch process run, spectra is acquired n times (step 210 in FIG. 3), where n is an integer greater than 1. The sampling interval between successive OES data acquisitions, i.e. spectra acquisitions, may vary from 0.01 to 1.0 seconds or faster. Each acquired OES data set, i.e. spectrum, contains m measured light intensities corresponding to the m pixels of a CCD detector, each pixel corresponding to a certain light wavelength projected upon the pixel by a diffraction grating which is typically employed as a light dispersion device in light detection device 34. CCD detectors may have from 256 to 8192 pixels, depending on the desired spectral resolution, but pixel numbers of 2048 or 4096 are most commonly used. Two dimensional detectors, for example, having 4 k×4 k pixels also may be used.

Next, OES data matrices $[X]^{[i]}$ are set up (step 215) for all plasma etch process runs i=1, 2, . . . k. Each matrix $[X]^{[i]}$ is an n×m matrix, where acquired spectra is arranged in rows of the matrix, such that the rows correspond to n instants in time when OES data is taken, and columns correspond to the pixel number m. Subsequently, an n×m average OES data matrix $[X]^{avg}$ is optionally calculated (step 220) by averaging each element of all acquired matrices $[X]^{[i]}$ over all i=1, 2, . . . k plasma etch process runs. Optional OES spectra normalization may be performed before calculating the average. When k=1, there is only a single wafer OES measurement, in which case there is no average OES matrix computed.

In one embodiment, the OES data matrix $[X]^{[i]}$ may be optionally normalized as follows. The OES data matrix $[X]^{[i]}$ is an n×m matrix with components $x_{i,j}$, where i=1, 2, . . . n and each row corresponds to an OES snapshot at time t; and j=1, 2 . . . m and each column corresponds to a trend at wavelength λ, so each column is a single wavelength trend. The OES data normalization may be applied in two ways. In a first way, the method selects a reference snapshot at time R (i.e., R-throw), $S_R = x_{R,j}$, and then divides every OES data by the reference snapshot, $x_{i,j} = x_{i,j}/x_{R,j}$. There can be a single time snapshot or the snapshot averaged in a period of time. In a second way, the method selects a reference wavelength $\lambda_R$ (i.e., R-th column) and then divides every wavelength by the intensity of the reference wavelength $x_{i,j} = x_{i,j}/x_{i,R}$. Similarly, there can be a single wavelength or an average of certain band of wavelengths. The inventors have discovered that normalization addresses intensity drift occurring during the OES runs between different wafers.

Subsequently, and as detailed in the '990 patent, noise is filtered (step 225) from the average OES data matrix $[X]^{avg}$, matrices $[X]^{[i]}$ and $[X]^{avg}$ are truncated (step 230) to remove spectra acquired during plasma startup and optionally following actual etch process endpoint, and a mean OES data matrix $[S_{avg}]$ is computed (step 235), wherein all elements of each column are set to the average across the entire column (i.e. across all instants in time) of the elements of the average OES data matrix $[X]^{avg}$, and subtracted (step 240) from each acquired OES data matrix $[X]^{[i]}$ i=1, 2, . . . k, to perform the step of de-meaning, i.e. average subtraction, prior to constructing a multivariate model of the acquired OES data.

Next, in one, non-limiting embodiment, a method, PCA, of determining the principal components weights [P] (see step 242 between step 240 and step 245 in FIG. 3) used in a multivariate analysis, to transform the OES data, is described in the following steps. Other multivariate data analysis methods, for example, Independent Component Analysis (ICA) method, may be also used. PCA is an example of unsupervised training method. Other supervised methods may also be used, as long as target values for each or some OES spectra are available, such as partial least square (PLS), support vector machine (SVM) regression or classification methods. The target values might be obtained from xSEM, transmission electron microscopy (TEM), optical critical dimension (OCD) spectroscopy, critical dimension scanning electron microscope (CDSEM), or other tools.

During Step 1, the mean spectrum of [X] is subtracted from each row (step 240 in FIG. 3), but the data is optionally not normalized using [X]'s standard deviation.

During Step 2, a covariance matrix cov(λ)=$[\sigma^2_{kj}]$ is computed. The covariance matrix is of m×m. For each column (each wavelength), the average $\dot{x}_j$ is calculated. Then, the variance of column j is:

$$\sigma^2_{jj} = \Sigma_i (xi,j - \dot{x}j)(xi,j - \dot{x}j)/n-1, j=1,2 \ldots m \qquad (1)$$

The covariance of row k and column j is:

$$\rho^2_{kj} = \Sigma_i (xi,j - \dot{x}k)(xi,j - \dot{x}J)/n-1, \sigma^2_{kj}, j=1,2 \ldots m,$$
$$k=1,2 \ldots m, k \neq j \qquad (2)$$

During Step 3, the eigenvectors and the eigenvalues of the covariance matrix that satisfy the equation [Covariance matrix]·[Eigenvector]=[Eigenvalue]·[Eigenvector] are calculated. This is done by performing singular value decomposition of covariance matrix cov(λ):

$$P'\text{cov}(\lambda)P = L \qquad (3)$$

where, L is a diagonal matrix of the eigenvalues of cov(λ), and P is the matrix of the eigenvectors of cov(λ). The eigenvalues are ordered in descending order, enabling the method to find the principal components weights in order of significance. For example, in a particular software, the top three (maximum five) eigenvectors are used.

The de-meaned OES data $[X]^{[i]}-[S_{avg}]$ is then used as input into the multivariate analysis (step 245), such as for example, PCA, using the derived weights vector P derived above, to transform the OES data vector into the PCA domain.

The inventors have discovered that by grouping the principal components weights Pj ($\lambda$j) into two separate groups corresponding to positive and negative weighted wavelengths, separate trends Tj are created, where $T^+j+T^-j=Tj$. Each $T^+j$ or $T^-j$ is a single positive trend. Hence, all conventional trend operations, such as snapshot normalization and taking a ratio between any of them, can be easily applied to $T^+j$ and $T^-j$.

In one embodiment, the vector [P] is calculated, and subsequently, the positive vector $[P^+]$ and the negative vector $[P^-]$ are formed. For example, $[P^+]$ is formed by setting all negative values in [P] to zero, and $[P^-]$ is formed by setting all positive values in [P] to zero, and then taking the absolute value (i.e., converting to positive numbers).

In step 245, the de-meaned OES data $[X]^{[i]}-[S_{avg}]$ along with the determined vector [P] are used to derive the transformed OES data into the PCA domain $$[T^+]=([X]-[S_{avg}])[P^+] \text{ and } [T^-]=([X]-[S_{avg}])[P^-] \quad (4)$$

The method described herein generates synthetic wavelengths (corresponding to positive and negative weighted natural wavelengths) to create single signed trends (transformed OES vectors). For example, positive and negative synthetic wavelengths are created:

$$\Lambda^+_l = \Sigma_{j=1}^{n1} w^+_j S_j \text{ and } \Lambda^-_l = \Sigma_{k=1}^{n2} |w^-_k| S_k \quad (5)$$

where n1 is the number of positive weights and n2 is the number of negative weights, and $$T_l = \Sigma_{i=1}^{n} w_i S_i = \Sigma_{j=1}^{n1} w^+_j S_j - \Sigma_{k=1}^{n2} |w^-_k| S_k = \Lambda^+_l - \Lambda^-_l. \quad (6)$$

where, $S_i$ is the intensity of $\lambda_i$ at time $t_i$, and $T_1$, $\Lambda^+_1$ and $\Lambda^-_1$ are all varying with time.

Having determined the synthetic wavelengths and the resulting trends $[T^+]=[\Lambda^-]$ and $[T^-]=[\Lambda^-]$, the second phase of the endpoint detection method is performed by using functional forms of time evolving values of $[T^+]$ and $[T^-]$. Since trends $[T^+]$ and $[T^-]$ are already positive signals, it is possible to divide each other to get enhanced signals without doing any offset to shift the trend upward being all positive, and then applying the offsets to new wafers in real time. For example, in one embodiment, the ratio $T^+_1(t)/T^+_3(t)$ is calculated. However, in other embodiments, any other functional forms may be calculated such as squares of the ratio of the synthetic wavelengths or just a single synthetic wavelength.

Since the goal of the first phase is to pre-calculate useful multivariate model parameters for later in-situ etch endpoint detection, various parameters are saved for later use. In step 250, the mean OES data matrix $[S_{avg}]$ is saved to volatile or non-volatile storage media, to facilitate de-meaning of in-situ measured OES data. Also in this step, the vector [P] of principal components (PC) weights is saved to volatile or non-volatile storage media to facilitate rapid transformation of in-situ measured OES data into a transformed OES data vector [T].

In some cases, inventors have discovered that it is useful for endpoint detection reliability to shift the calculated values of elements $T_i$ of the transformed OES data vector [T], i.e. the principal components, as they evolve over time, such that they concentrate around the value of zero, rather than grow to large positive or negative values. This shifting is accomplished in step 255, where at least one element $T_i$ of the transformed OES data vector [T] is evaluated for each instant in time during the etch process when measurements were taken, and a minimum value of such element, or elements, $\min(T_i)$, are found. For this purpose, time-evolving data from the average OES data matrix $[X_{avg}]$, or other data, may be used. This minimum value is then stored in step 260 on volatile or non-volatile storage media for later use in in-situ endpoint detection, whereby the minimum value $\min(T_i)$ of an element $T_i$ of the transformed OES data vector [T] can be used to shift the time-evolving values of the same element $T_i$ of the transformed OES data vector [T], calculated from in-situ measured optical emission spectroscopy (OES) data.

The stored data values on volatile or non-volatile storage media are now ready to be used in the second phase, i.e. in in-situ etch endpoint detection.

Figure 4:
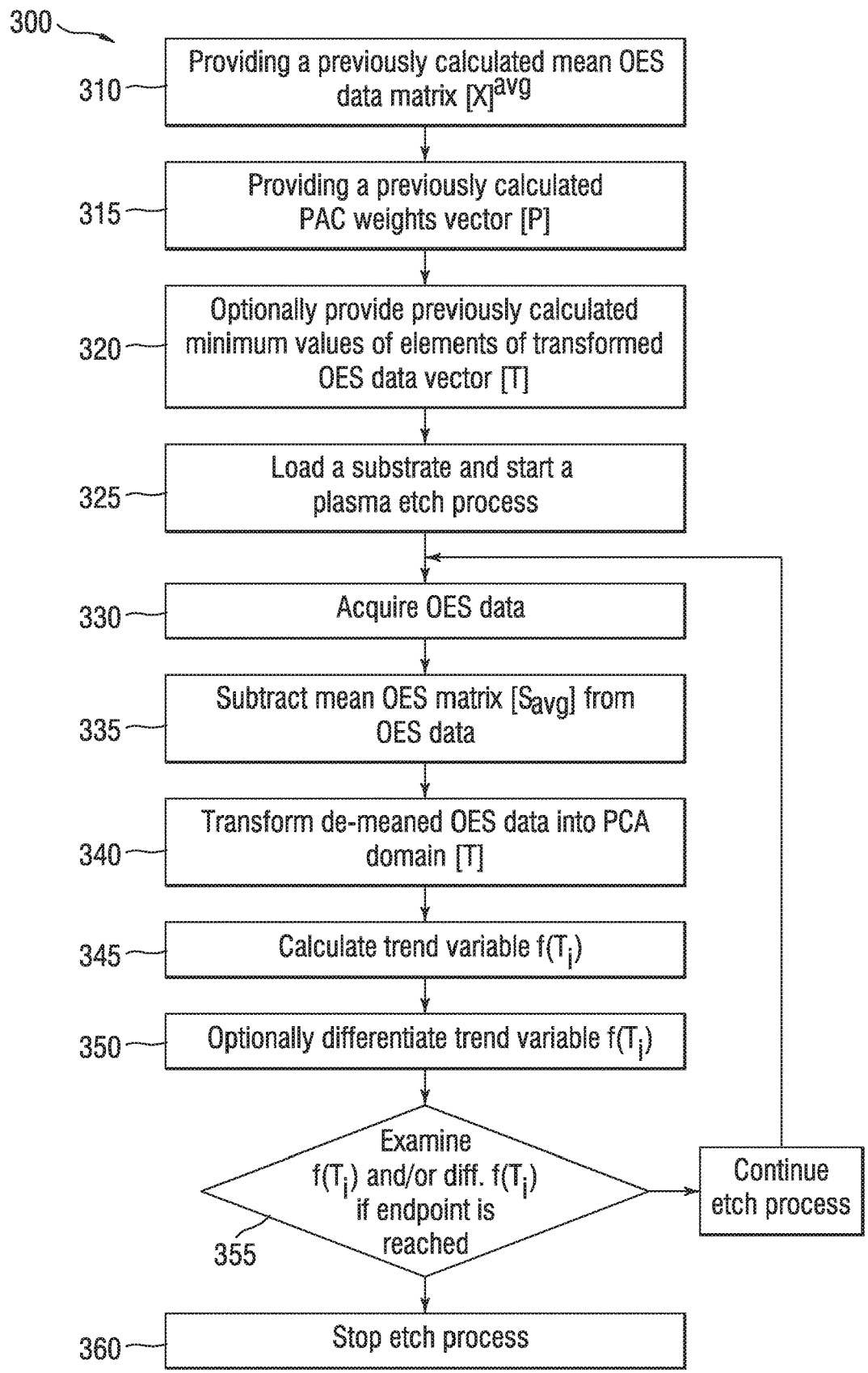
FIG. 4 is an exemplary flowchart of the method of in-situ etch endpoint detection.

FIG. 4 shows an exemplary flowchart 300 of the process of in-situ endpoint detection in the plasma etch processing system 100, equipped with light detection device 34, having available the data saved in steps 250 and 260 of flowchart 200.

In steps 310 and 315, the previously determined mean OES data matrix $[S_{avg}]$ and the vector [P] of principal components (PC) weights are retrieved from volatile or non-volatile storage media and loaded into memory of the controller 55 of the plasma etch processing system 10 of FIG. 1. Controller 55 will perform all the in-situ calculations needed to determine endpoint of a plasma process. Also, if used, at least one minimum value $\min(T_i)$ of an element $T_i$ of the transformed OES data vector [T] can be loaded from volatile or non-volatile media into the memory of controller 55, in step 320.

In step 325, a substrate 25 is loaded into the plasma etch processing system 10 and a plasma is formed in processing region 45.

In step 330, the light detection device 34 is used to acquire OES data in-situ, i.e., during the etch process evolving over time.

In step 335, the retrieved mean OES data matrix $[S_{avg}]$ elements are subtracted from each acquired OES data set, i.e. spectrum, to de-mean the acquired spectra prior to transformation using the already developed multivariate model.

In step 340, the already developed PCA multivariate model is used to transform the de-meaned OES data into a transformed OES data vector [T], i.e. the principal components, using Eq. 4 and the retrieved vector [P] of principal components (PC) weights. This process is very fast because it involves only a simple multiplication, and is thus amenable to in-situ real-time calculation. The computed elements $T_i$, e.g., natural wavelengths $\Lambda^+_i$ and $\Lambda^-_i$ of the transformed OES data vector [T], as they evolve over time, can be used for the endpoint detection (step 345).

In step 350, each time-evolving element $T_i$ of the transformed OES data vector [T] can be optionally differentiated to further facilitate the endpoint detection using trend variable slope data.

After the time-evolving trend variable has been calculated, controller 55 of the plasma etch processing system 10 makes a decision (step 355) whether an endpoint has been reached. If an endpoint has been reached, the etch process ends at step 360, otherwise the etch process continues and is continuously monitored for each endpoint via steps 330-355 of flowchart 300.

Figure 5:
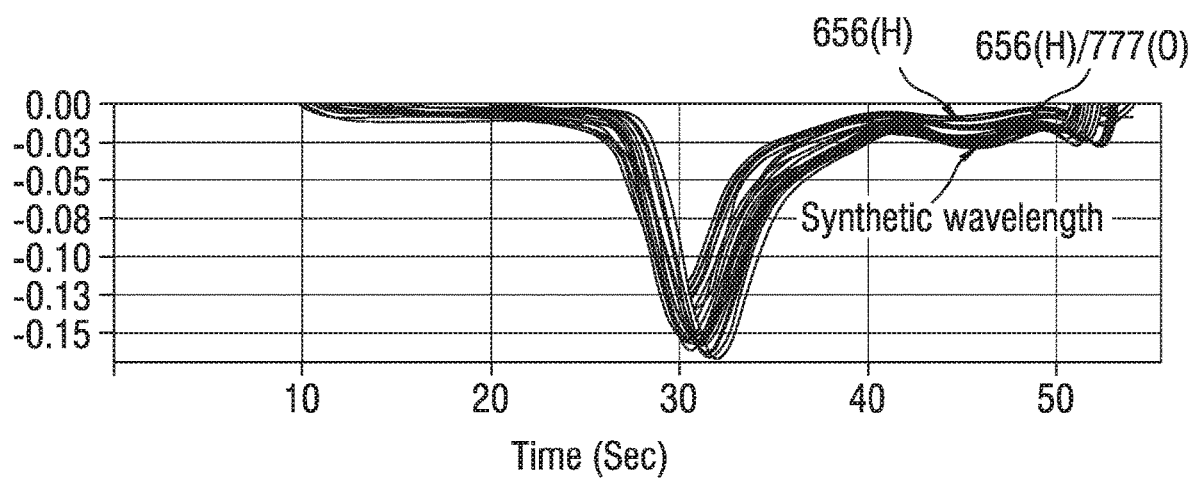
FIG. 5 shows an exemplary graph of time evolution of a time derivative of a trend variable functional form involving the ratio of synthetic wavelength trends and single wavelength trends.

FIG. 5 shows the time evolution of the time derivative of a trend variable for an etch process. A deep, and thus easily identified minimum, that the differentiated trend variable goes through at etch endpoint, is seen. The bottom group of traces corresponds to the trend obtained using the trend $\Lambda^+_1(t)/\Lambda^+_3(t)$, in which synthetic wavelengths were applied. Various traces are shown corresponding to different wafers used in different etch runs. FIG. 5 also shows the time evolution of other types of trends (for different wafers), including the time evolution of the time derivative of a single wavelength trend at $\lambda=656$ nm, and also the time evolution of the time derivative of the ratio of two single wavelength trends $\lambda=656$ nm and $\lambda=777$ nm. As seen in FIG. 5, the endpoint occurs around the 32 second point of the etch process.

Figure 6A:
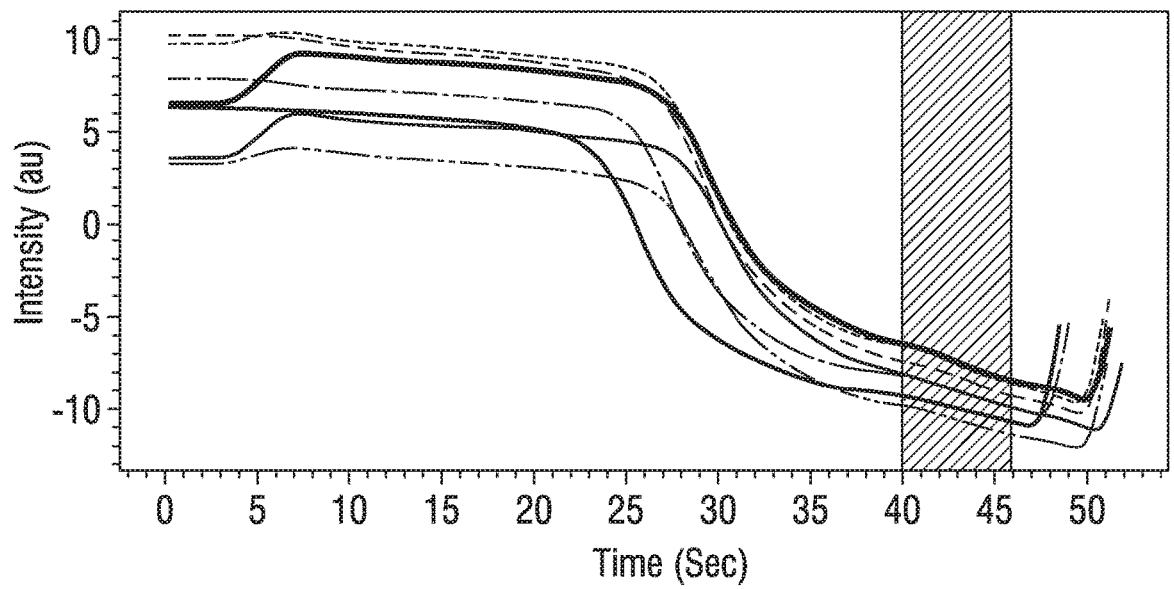
FIG. 6A shows an exemplary graph of time evolution of a trend variable functional form involving a ratio of synthetic wavelength trends.
Figure 6B:
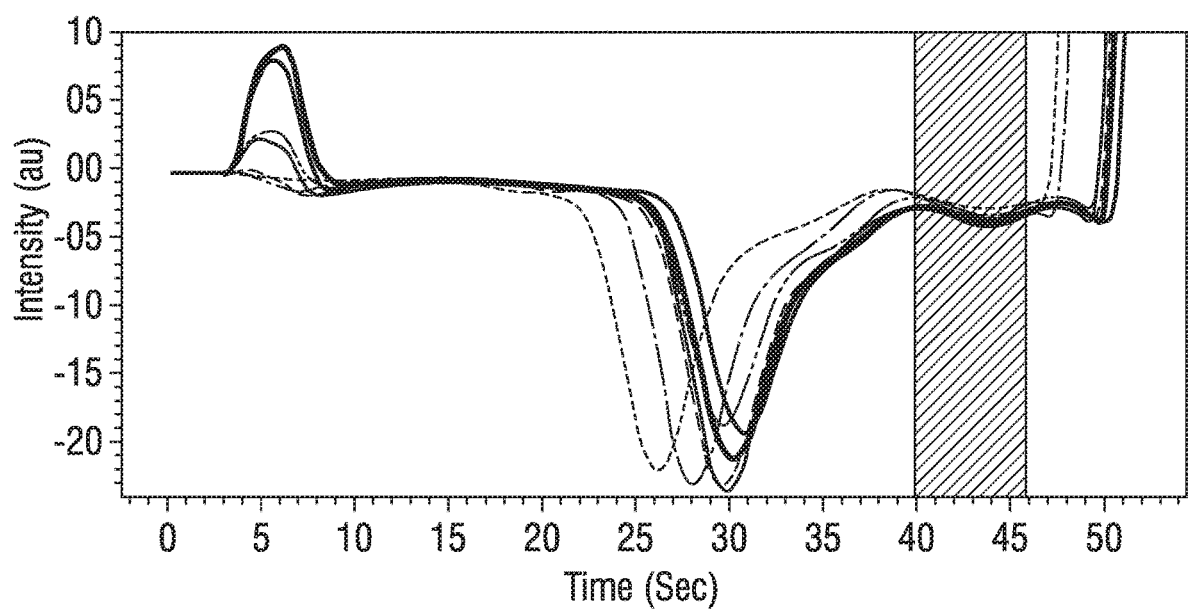
FIG. 6B shows an exemplary graph of time evolution of the time derivative of the trend variable functional form of FIG. 5A involving the ratio of synthetic wavelength trends.

FIG. 6A shows the time evolution of the trend $\Lambda^+_1(t)/\Lambda^+_3(t)$ for different wafers, and FIG. 6B shows the time evolution of the time derivative of the trend $\Lambda^+_1(t)/\Lambda^+_3(t)$ for different wafers, in another etch processing run.

Figure 7A:
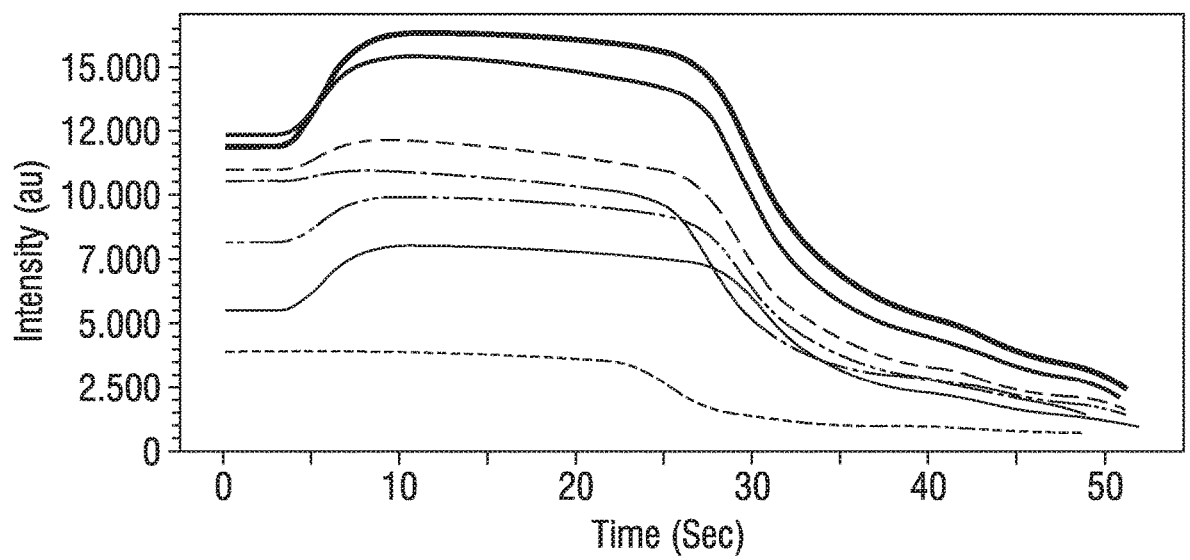
FIG. 7A shows an exemplary graph of time evolution of a trend variable functional form involving a single wavelength.
Figure 7B:
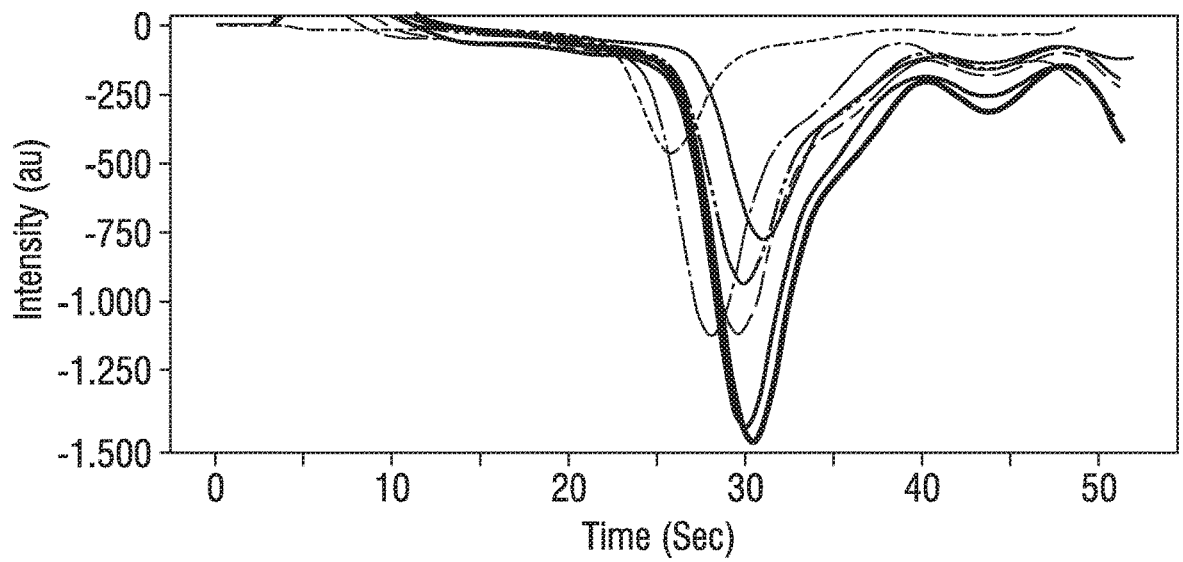
FIG. 7B shows an exemplary graph of time evolution of the time derivative of the trend variable functional form of FIG. 6A involving the single wavelength.

FIG. 7A shows the time evolution of a single wavelength trend at $\lambda=656$ nm for different wafers, and FIG. 7B shows the time evolution of the time derivative of the single wavelength at $\lambda=656$ nm for different wafers, in another etch processing run.

Figure 8A:
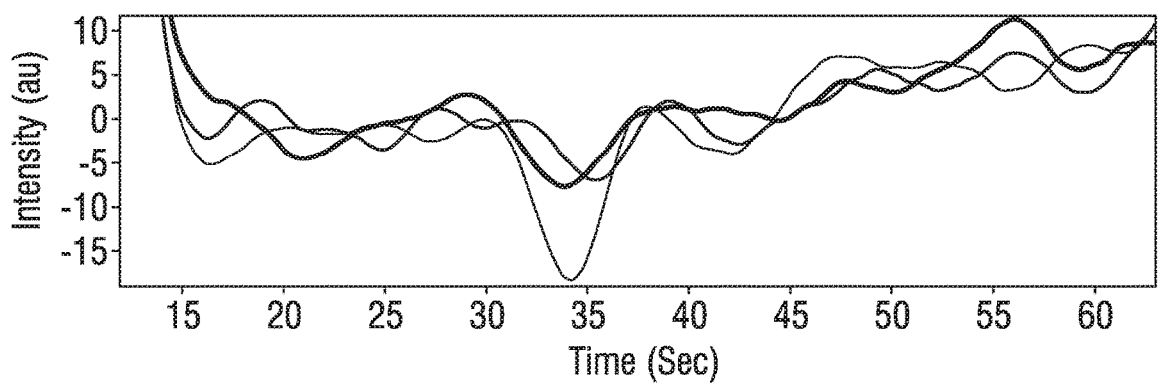
FIG. 8A shows an exemplary graph of time evolution of a time derivative of a trend variable functional form involving a single wavelength.
Figure 8B:
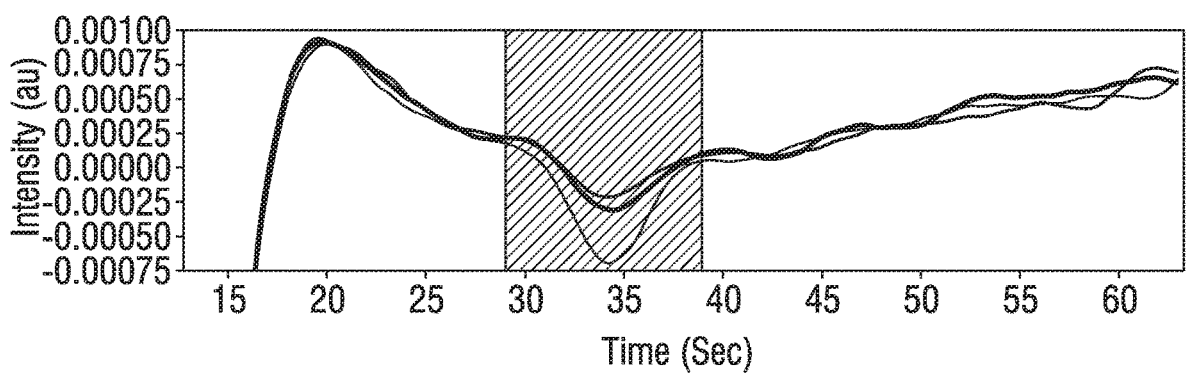
FIG. 8B shows an exemplary graph of time evolution of a time derivative of a trend variable functional form involving a ratio of synthetic wavelength trends.

FIG. 8A shows the time evolution of the time derivative of a single wavelength trend at $\lambda=260$ nm for different wafers, and FIG. 8B shows the time evolution of the time derivative of the trend obtained using the trend $\Lambda^+_1(t)/\Lambda^+_3(t)$ for different wafers, in another etch processing run.

Figure 8C:
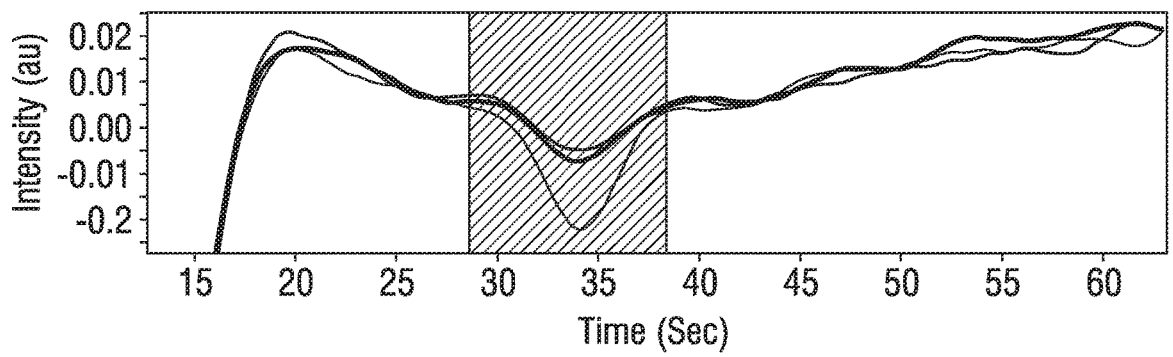
FIG. 8C shows an exemplary graph of time evolution of a time derivative of a trend variable functional form involving a single synthetic wavelength, with normalization.

FIG. 8C shows the time evolution of the time derivative of a synthetic wavelength trend using the normalization discussed above. The plot refers to a just a synthetic wavelength, not a ratio, since normalization has been pre-applied.

After the time-evolving trend variable has been calculated, controller 55 of the plasma etch processing system 10 needs to make a decision, in step 355, whether an endpoint has been reached. If indeed an endpoint has been reached, the etch process is ended at step 360, otherwise the etch process is continued, and continuously monitored for etch endpoint via steps 330-355 of flowchart 300.

Numerous modifications and variations of the present application are possible in light of the above teachings. It is therefore to be understood that within the scope of the appended claims, the application may be practiced otherwise than as specifically described herein.

The invention claimed is:

1. A method for determining etch process endpoint data in a plasma processing system, the method comprising:
    performing plasma etch process runs in a plasma processing chamber of an etch processing system;
    acquiring optical emission spectroscopy (OES) data from the plasma processing chamber during one or more etching processes;
    performing a multivariate data analysis on the OES data to generate synthetic OES data from the OES data by grouping emitted wavelengths; and
    using the synthetic OES data for later use in an in-situ determination of the etch process endpoint.

2. The method of claim 1, where the generating synthetic OES data comprises obtaining a transformed OES data vector [T], wherein $$[T]=([X]-[Savg])[P], \text{ where}$$

[X] is an OES data matrix, [P] is a weights vector, and [Savg] is an n×m mean OES data matrix, whose each element is computed as an average value of n elements of the corresponding column of [X]avg, which is an n×m average OES data matrix, whose each element is computed as an average of corresponding elements of the OES data matrix [X] over k etch process runs, n corresponding to instants in time when OES data is taken and m corresponding to the number of measured light intensities in the plasma processing chamber by a detector.

3. The method of claim 2, wherein
the generating synthetic OES data comprises grouping wavelengths corresponding to positive and negative weights.

4. The method of claim 3, wherein
the weights vector [P] is determined by:
calculating eigenvectors and eigenvalues of a covariance matrix associated with matrix [X];
ordering the eigenvalues in descending order, the eigenvalues representing the weights vector [P]; and
setting a positive weights vector [P+] by setting all negative components in [P] to zero and setting a negative weights vector [P−] by setting all positive components in [P] to zero and taking the absolute value thereof.

5. The method according to claim 4, further comprising:
obtaining a transformed OES data vector [T+] or [T−], wherein $$[T+]=([X]-[Savg])[P+], [T-]=([X]-[Savg])[P-].$$

6. The method according to claim 5, further comprising:
selecting a functional form involving elements of the transformed OES data vector [T+], or [T−] and computing a time evolution of the selected functional form.

7. The method according to claim 6, further comprising:
computing a time derivative of the selected functional form and computing a time evolution of the time derivative of the selected functional form.

8. The method according to claim 7, wherein
the functional form comprises [T+], [T−], the ratio [T+]/[T−], a power of the ratio [T+]/[T−], or a single element of the transformed OES data vector [T+] or [T−] or any mathematical form using [T+] and/or [T−].

9. The method of claim 1, further comprising
performing k plasma etch process runs in the plasma processing chamber, where k is an integer greater than zero, each of the k plasma etch process runs comprising:
    loading a substrate to be processed to the plasma processing chamber, the plasma processing chamber comprising a spectrometer having a detector comprising m pixels, each pixel corresponding to a different light wavelength;
    forming a plasma in the plasma etch processing chamber; and
        acquiring OES data from the plasma processing chamber during one or more etching processes, and forming an OES data matrix [X] for each of the k plasma etch process runs.

10. The method of claim 9, further comprising
computing an n×m average OES data matrix [X]avg, wherein each element is computed as an average of corresponding elements of the OES matrix [X] over the k etch process runs;
filtering noise from the average OES data matrix [X]avg;
truncating each OES data matrix [X] and [X]avg, where data acquired during plasma startup and for times beyond an etch process endpoint is discarded;
calculating an n×m mean OES data matrix [Savg], where each element is computed as an average value of n elements of the corresponding column of [X]avg;

subtracting [Savg] from matrix [X] for each k, to de-mean the OES data.

11. The method according to claim 2, wherein after forming the OES data matrix [X] for each of the plasma etch process runs, and before computing the n×m average OES data matrix [X]avg, the method normalizes the OES data matrix [X].

12. The method according to claim 11, wherein the OES data matrix normalization comprises selecting a reference snapshot at time R, xR,j, and then dividing every OES data by the reference snapshot, xi,j=xi,j/xR,j.

13. The method according to claim 12, wherein the reference snapshot is a single time snapshot or a snapshot averaged over a period of time.

14. The method according to claim 11, wherein the OES data matrix normalization comprises selecting a reference wavelength λR, and then dividing every OES data by the intensity at the reference wavelength xi,j=xi,j/xi,R.

15. The method according to claim 14, wherein the reference wavelength is a single wavelength or an average of band wavelengths.

16. A method for determining etch process endpoint data in a plasma processing system, the method comprising:
performing plasma etch process runs in a plasma processing chamber of an etch processing system;
acquiring optical emission spectroscopy (OES) data from the plasma processing chamber during one or more etching processes;
performing a multivariate data analysis on the OES data to generate synthetic OES data from the OES data by grouping emitted wavelengths corresponding to positive and negative weights associated with natural wavelengths; and
using the synthetic OES data for later use in an in-situ determination of the etch process endpoint.

17. The method of claim 16, wherein the multivariate data analysis is performed using independent component analysis.

18. The method of claim 16, wherein the multivariate data analysis is performed using a supervised multivariate data analysis method, the supervised multivariate data analysis method including support vector machine regression.

19. The method of claim 16, further comprising:
obtaining a transformed OES data vector [T+] or [T−], wherein $[T+]=([X]-[Savg])[P+], [T-]=([X]-[Savg])[P-],$
wherein

[X] is an OES data matrix, [P+] is a positive weights vector, [P−] is a negative weights vector, and [Savg] is an n×m mean OES data matrix, whose each element is computed as an average value of n elements of the corresponding column of [X]avg, which is an n×m average OES data matrix, whose each element is computed as an average of corresponding elements of the OES data matrix [X] over k etch process runs, n corresponding to instants in time when OES data is taken and m corresponding to the number of measured light intensities in the plasma processing chamber by a detector.

20. The method according to claim 19, further comprising:
selecting a functional form involving elements of the transformed OES data vector [T+], or [T−], and computing a time evolution of the selected functional form.

21. The method according to claim 20, further comprising:
computing a time derivative of the selected functional form and computing a time evolution of the time derivative of the selected functional form.

22. The method according to claim 21, wherein the functional form comprises [T+], [T−], the ratio [T+]/[T−], a power of the ratio [T+]/[T−], or a single element of the transformed OES data vector [T+] or [T−] or any mathematical form using [T+] and/or [T−].

* * * * *

UNITED STATES PATENT AND TRADEMARK OFFICE
CERTIFICATE OF CORRECTION

Page 1 of 1

PATENT NO. : 10,910,201 B1
APPLICATION NO. : 16/548333
DATED : February 2, 2021
INVENTOR(S) : Chen et al.

It is certified that error appears in the above-identified patent and that said Letters Patent is hereby corrected as shown below:

In the Claims

Column 11, Claim 2, Line 56, delete "where" and insert -- wherein --, therefor.

Column 12, Claim 6, Line 28, delete "[T-]" and insert -- [T-], --, therefor.

Column 13, Claim 10, Line 1, delete "[X]" and insert -- [X], --, therefor.

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*